United States Patent
Miwa

[11] Patent Number: 5,787,458
[45] Date of Patent: Jul. 28, 1998

[54] CONTENT ADDRESSABLE MEMORY OF A SIMPLE CONSTRUCTION CAPABLE OF RETRIEVING A VARIABLE WORD LENGTH DATA

[75] Inventor: Tohru Miwa, Tokyo, Japan

[73] Assignee: NEC Corporation, Tokyo, Japan

[21] Appl. No.: 706,470

[22] Filed: Sep. 3, 1996

[30] Foreign Application Priority Data

Aug. 31, 1995 [JP] Japan .................................. 7-248767

[51] Int. Cl.⁶ .......................... G06F 12/04; G11C 15/00
[52] U.S. Cl. ................................ 711/108; 365/49
[58] Field of Search .......................... 711/108; 365/49; 395/306, 886

[56] References Cited

U.S. PATENT DOCUMENTS

| | | | |
|---|---|---|---|
| 5,502,832 | 3/1996 | Ali-Yahia et al. | 711/108 |
| 5,642,114 | 6/1997 | Komoto et al. | 365/49 |
| 5,677,883 | 10/1997 | Miwa | 365/49 |

FOREIGN PATENT DOCUMENTS 5-189978  7/1993  Japan .

*Primary Examiner*—Glenn Gossage
*Attorney, Agent, or Firm*—Sughrue, Mion, Zinn, Macpeak & Seas, PLLC

[57] ABSTRACT

A content addressable memory system includes one retrieval sense amplifier provided in common with a plurality of memory words. A logic operation between a result of retrieval outputted from the sense amplifier and the result of a preceding retrieval stored in a one-bit working register provided for the same sense amplifier is carried out by a control gate also provided for the same sense amplifier, and the result of the logic operation is stored back in the same working register. A plurality of working registers may be provided for each control gate and sense amplifier. The content addressable memory system can retrieve a variable word length data and can be realized with a reduced circuit area.

7 Claims, 7 Drawing Sheets

FIGURE 6B

| 3-INPUT SELECTOR 38₁ | 3-INPUT SELECTOR 38₂ | LOGIC OPERATION RESULT |
|---|---|---|
| not(R(t+1)) | R(t+1) | not(R(t+1)) |
| R(t+1) | not(R(t+1)) | R(t+1) |
| not(R(t+1)) | "0" | or (R(t),not(R(t+1))) |
| R(t+1) | R(t+1) | and (R(t),not(R(t+1))) |
| "0" | "0" | or (R(t),(R(t+1))) |
| "0" | not(R(t+1)) | and (R(t),(R(t+1))) |
| "0" | "0" | R(t) |

CONTENT ADDRESSABLE MEMORY OF A SIMPLE CONSTRUCTION CAPABLE OF RETRIEVING A VARIABLE WORD LENGTH DATA

BACKGROUND OF THE INVENTION

1. Field of the Invention

The present invention relates to a content addressable memory, and more specifically to a content addressable memory including a logical processing means for a retrieval processing and a word length extension, provided for each retrieval circuit.

2. Description of Related Art

In conventional memories such as a RAM (random access memory) and a ROM (read only memory), a data access such as a data reading and a data writing is carried out by designating a word which stores or holds data, by an address. In a content addressable memory, on the other hand, a retrieval data is supplied, and data held in each of the stored words is compared to the supplied retrieval data, and then, there is generated an address indicating the word holding the data which is the same as or similar to the supplied retrieval data.

Most content addressable memories in the prior art have been so constructed that the length of a word to be retrieved is limited to be no greater than a predetermined number of bits, and therefore, they cannot handle variable word length data as in retrieval of a dictionary for natural language.

Furthermore, since most content addressable memories in the prior art have only the function of simply generating an address indicative of the word corresponding to the retrieval data, for example in an application using a retrieval equation in database processing, it is necessary to process the result of retrieval outputted from the content addressable memory, by use of a computer system provided externally to the content addressable memory.

As one example of a prior art content addressable memory capable of handling a variable word length data, Japanese Patent Application Laid-open Publication No. JP-A-5-189978 proposes a new structure for extending the memory word length in a content addressable memory having a retrieval circuit provided for each plurality of memory words.

As shown in FIG. 1, which is a block diagram of a portion of the content addressable memory disclosed in JP-A-5-189978, for each four memory words 26, W(1, 1), W(2, 1), W(3, 1), and W(4, 1), . . . , and W(1, n), W(2, n), W(3, n), and W(4, n), there is provided one sense amplifier (SA) 28 ($28_1$ to $28_n$), one retrieval line 30 ($30_1$ to $30_n$), one control gate (CGATE) 32 ($32_1$ to $32_n$), one working register (WR) 34 ($34_1$ to $34_n$), and one retrieval circuit 22 ($22_1$ to $22_n$) which is composed of data registers (for example, DR1 to DR4) 36 ($36_{11}$ to $36_{41}$, . . . , $36_{1n}$ to $36_{4n}$) and transistors 37 ($37_{11}$ to $37_{41}$, . . . , $37_{1n}$ to $37_{4n}$) provided for the data registers 36, respectively, for controlling the corresponding data register. Retrieval circuit block 18 comprises the plurality of retrieval circuits $22_1$ to $22_n$.

The transistors $37_{1x}$ (where x=1 to n) are connected to receive a common control signal $Z_1$, and are controlled with the same timing as the timing for selecting the memory words W(1, 1) to W(1, n) of the memory words 26, and the transistors $37_{2x}$ are connected to receive a common control signal $Z_2$ and are controlled with the same timing as the timing for selecting the memory words W(2, 1) to W(2, n). The transistors $37_{3x}$ are connected to receive a common control signal $Z_3$ and and are controlled with the same timing as the timing for selecting the memory words W(3, 1) to W(3, n), and the transistors $37_{4x}$ are connected to receive a common control signal $Z_4$ and and are controlled with the same timing as the timing for selecting the memory words W(4, 1) to W(4, n).

The sense amplifier 28 ($28_1$ to $28_n$) detects a signal condition on one retrieval line 30 ($30_1$ to $30_n$), and outputs a high level signal ("1") when the signal condition on the retrieval line 30 indicates a "match" and a low level signal ("0") when the signal condition on the retrieval line 30 indicates a "non-match".

The control gate 32 ($32_1$ to $32_n$) is a logic operation means for executing a logic operation between the retrieval result R(t) of the preceding retrieval data D(t) of an adjacent higher place memory word address held in the data register 36 and the retrieval result R(t+1) of the retrieval data D(t+1) of the current memory word address. In the example shown in FIG. 1, the control gate is constituted of an AND gate.

Referring to FIG. 2, there is shown a block diagram of a content addressable memory (CAM), which is generally designated with Reference Numeral 10. The shown content addressable memory 10 includes a content addressable memory (CAM) array 12, a data and mask drive block 14, an address decoder 16, a retrieval circuit block 18 and an address encoder 20, which are coupled as shown.

The content addressable memory 10 has a memory model, in which the content addressable memory operates similarly to a RAM or a ROM, and a retrieval mode. In the memory mode, the address decoder 16 designates an address in the content addressable memory array 12, and the reading and the writing of the content of the designated address is carried out by the data and mask drive block 14. In this memory mode, the retrieval circuit block 18 and the address encoder 20 do not operate. In the retrieval mode, the data and mask drive block 14 supplies a mask data designating the bit position to be subjected to the retrieval, and a retrieval data.

The content addressable memory 10 having the retrieval circuit block 18 selects each one of the four memory words coupled to the same retrieval circuit 22 (FIG. 1), by the address decoder 16, so that one block is constituted of one selected memory word within each of the memory word groups each consisting of four memory words, and the retrieval is carried out concurrently within the same block.

If the content addressable memory 10 having the retrieval circuit block 18 is viewed from a logical address, not from a physical location, the content addressable memory can be divided into four logical address memory blocks $LAB_1$, $LAB_2$, $LAB_3$ and $LAB_4$, each consisting of "n" memory words, as shown in FIG. 3. Namely, the "n" memory words W(1, 1), . . . , W(1, n) are selected as the logical address memory block $LAB_1$, and the "n" memory words W(2, 1), . . . , W(2, n) are selected as the logical address memory block $LAB_2$. The "n" memory words W(3, 1), . . . , W(3, n) are selected as the logical address memory block $LAB_3$, and the "n" memory words W(4, 1), . . . , W(4, n) are selected as the logical address memory block $LAB_4$. In other words, each of the logical address memory blocks is constituted of only a memory word of the logical address of the same rank within each four memory words in common to each one of the sense amplifiers 28. For example, the logical address memory block $LAB_2$ is constituted of only a memory word W(2, 1), . . . , W(2, n) of the logical address of the same second rank "2" within each four memory words in common to each one of the sense amplifiers 28, and the logical address memory block $LAB_3$ is constituted of only a memory word W(3, 1), . . . , W(3, n) of the logical address of the same third rank "3" within each four memory words in common to each one of the sense amplifiers 28.

Now, one example of the retrieval operation of the prior art content addressable memory will be explained with reference to FIGS. 1 to 3.

First of all, all the working registers 34 ($34_1, \ldots, 34_n$) and all the data registers 36 ($36_1, \ldots, 36_n$) are initialized. Namely, all the data registers 36 ($36_1, \ldots, 36_n$) hold data "1".

In this initialized condition, a retrieval of a retrieval data D(t) is conducted. First, all the memory words 26 {W(1, 1), . . . , W(1, n)} of the first logical address memory block $LAB_1$ are simultaneously driven, so that data held in the memory cells of these memory words are compared with the retrieval data D(t). On the basis of a "match" or "non-match" of the retrieval result, the signal condition of the respective retrieval lines 30 ($30_1, \ldots, 30_n$) changes or does not change, which is detected by the corresponding sense amplifier 28 ($28_1, \ldots, 28_n$). The result of the detection is supplied to the corresponding control gate 32 ($32_1, \ldots, 32_n$).

Here the control gate 32 is constituted of an AND gate 38 as shown in FIG. 3. One input of each AND gate 38 is connected to receive the data "1" held in all the corresponding initialized data registers 36, and the other input of the AND gate 38 is connected to receive the output of the corresponding sense amplifier. Therefore, the AND gate 38 outputs the retrieval result R(t) as it is. This retrieval result R(t) is held in the corresponding working register 34 ($34_1, \ldots, 34_n$), and is also held through the corresponding transistor 37 ($37_{11}, \ldots, 37_{1n}$) turned on by the control signal signal $Z_i$ (i=1 to 4) which is driven simultaneously with the above mentioned memory word driving, into the data register 36 ($36_{11}, \ldots, 36_{1n}$) corresponding to the memory word 26 {W(1, 1), . . . , W(1, n)}.

Thus, the retrieval of the retrieval data D(t) has been completed for the first logical address memory block $LAB_1$.

Next, the retrieval of the retrieval data D(t) is conducted for the second logical address memory block $LAB_2$, similarly to the first logical address memory block $LAB_1$, and the retrieval result R(t) is held in the data register 36 ($36_{21}, \ldots, 36_{2n}$) corresponding to the memory word 26 {W(2, 1), . . . , W(2, n)}. Thus, the retrieval has been completed for the second logical address memory block $LAB_2$. Similarly, the retrieval of the retrieval data D(t) is conducted for the third and fourth logical address memory blocks $LAB_3$ and $LAB_4$, and the retrieval result R(t) is held in the data register 36 ($36_{31}, \ldots, 36_{3n}$) and 36 ($36_{41}, \ldots, 36_{4n}$), respectively. Thus, the retrieval of the retrieval data D(t) is completed.

Next, the retrieval of a retrieval data D(t+1) is conducted. Similarly to the retrieval of the retrieval data D(t), all the memory words 26 of the first logical address memory block $LAB_1$ are simultaneously driven, so that data held in the memory words are compared with the retrieval data D(t+1), and the signal condition of the respective retrieval lines 30 is detected by the corresponding sense amplifier 28. The retrieval result R(t+1) for the memory words 26 {W(1, 1), . . . , W(1, n)} is supplied to the corresponding AND gate 38 ($38_1, \ldots, 38_n$). The AND gate 38 outputs a logical conjunction (AND) between the retrieval result R(t+1) and the retrieval result R(t) of the immediately preceding retrieval which is held in the data register 36 concerning the immediately preceding memory word (the AND gate for the first row memory words {W(1, 1), . . . , W(1, n)} receives the output of an inter-block register $24_1$, and the AND gate for the second row memory words {W(2, 1), . . . , W(2, n)} receives the output of the data register $36_{11}$ for the memory word W(1, 1), and so forth). The result of the logical conjunction (AND) is held in the corresponding working register 34 ($34_1, \ldots, 34_n$), and is also held in the data register 36 ($36_{11}, \ldots, 36_{1n}$) through the corresponding transistor 37 turned on by the control signal $Z_i$.

Next, similarly to the above mentioned retrieval of the retrieval data D(t+1) for the first logical address memory block $LAB_1$, the retrieval of the retrieval data D(t+1) is conducted for the second logical address memory block $LAB_2$. A logical conjunction (AND) is obtained between the retrieval result R(t+1) for the memory word W(2, i $(2 \leq i \leq n)$) and the preceding retrieval result R(t) for the preceding memory word W(2, i-1), and the result of the logical conjunction (AND) is stored in the data register 36 ($36_{21}, \ldots, 36_{2n}$). Thus, the retrieval for the second logical address memory block $LAB_2$ has been completed. Similarly, the simultaneous retrieval is conducted for the third and fourth logical address memory blocks $LAB_3$ and $LAB_4$, respectively.

If a further retrieval is conducted, the operation will be conducted similarly to the above mentioned operation. In this case, since each of the data registers 36 holds the result of the logical conjunction (AND) between the retrieval result R(t) for the first retrieval data D(t) and the retrieval result R(t+1) for the second retrieval data D(t+1), it is sufficient if the third retrieval is conducted considering that the result of the logical conjunction (AND) held in the data register is the result of the retrieval for the retrieval data D(t)+D(t+1) having an extended bit length. Further, in the case of extending the bit length of the retrieval data, it is sufficient if the above mentioned retrieval is further conducted.

However, a prior art content addressable memory as shown in FIG. 1 capable of handling a variable word length data, requires, for each sense amplifier in common with a plurality of memory words, the working register having the memory capacity of at least one bit and the one-bit data registers of the number equal to the number of memory words coupled to the sense amplifier. Therefore, in the case that one sense amplifier is provided in common to each relatively large number of memory words, this prior art content addressable memory needs a large area overhead.

Furthermore, the prior art content addressable memory cannot handle a retrieval equation which is required at the time of conducting a search in a data base, and therefore, it has been necessary to carry out a collective operation for a large amount of "match" memory words, by use of a computer system provided externally to the content addressable memory.

SUMMARY OF THE INVENTION

Accordingly, it is an object of the present invention to provide a content addressable memory which has overcome the above mentioned defect in the conventional art.

Another object of the present invention is to provide a content addressable memory capable of handling a variable word length data and requiring only a small area overhead for a collective operation of "match" memory words.

The above and other objects of the present invention are achieved in accordance with the present invention by a content addressable memory comprising:

a memory array comprises of a number of memory words divided into a plurality of logical address memory blocks;

a plurality of retrieval sense amplifiers, each provided in common to a plurality of memory words of the same number as the number of the logical address memory blocks so that the plurality of memory words are included, one for one, in the plurality of logical address memory blocks, respectively, and each of the logical address memory blocks is constituted of only a memory word of the logical address of the same rank within the plurality of memory words in common to each one of the plurality of retrieval sense amplifiers;

a plurality of hold means, each provided for a corresponding one of the retrieval sense amplifiers, for holding the result of retrieval outputted from the corresponding retrieval sense amplifier;

a plurality of logic operation processing means, each having a first input connected to an output of a corresponding one of the retrieval sense amplifiers, a second input connected to an output of a corresponding one of the hold means, and an output connected to an input of the corresponding hold means, each of the logic operation processing means executing a logic operation between the result of the retrieval held in the corresponding hold means and the result of the retrieval outputted from the corresponding retrieval sense amplifier, and the result of the logic operation being stored back in the corresponding hold means, the content addressable memory being so controlled that, when a retrieval is conducted, all the memory words included in a selected one of the plurality of logical address memory blocks are retrieved concurrently for the same retrieval data by means of the retrieval sense amplifiers, and the logic operation between the result of current retrieval outputted from each of the retrieval sense amplifiers and the result of the preceding retrieval held in the corresponding hold means is executed by the corresponding logic operation processing means, and the result of the logic operation executed is stored back in the same corresponding hold means.

When a retrieval of a retrieval data having a data length longer than that of one memory word is conducted, the content addressable memory is so controlled that, all the memory words included in a first memory block of the plurality of logical address memory blocks are retrieved concurrently for a first retrieval data portion of the retrieval data by means of the retrieval sense amplifiers, and the retrieval result of the first retrieval data portion is stored in the hold means corresponding to each of the retrieval sense amplifiers, and then, all the memory words included in a second memory block of the plurality of logical address memory blocks including a memory word continuous in a logical address to each of the memory words included in the first memory block, are retrieved concurrently for a second retrieval data portion of the retrieval data continuous to the first retrieval data portion, by means of the retrieval sense amplifiers, and a logical conjunction (AND) operation between the current retrieval result of the second retrieval data portion outputted from each of the retrieval sense amplifiers and the preceding retrieval result of the first retrieval data portion held in the corresponding hold means is executed by the corresponding logic operation processing means, and the result of the logic operation executed is stored back in the same corresponding hold means, whereby the result of the retrieval of the retrieval data having a data word length extending over two memory words is obtained from each of the hold means.

In one embodiment of the content addressable memory system, each of the retrieval sense amplifiers has the output connected to one of a plurality of inputs of the corresponding logic operation processing means, and wherein for each of the retrieval sense amplifiers, there is a plurality of hold means having an output respectively connected to the other inputs of the plurality of inputs of the corresponding logic operation processing means.

In a preferred embodiment of the content addressable memory system, each of the hold means is constituted of a memory circuit comprises of a pair of inverters each having an input connected to an output of the other inverter. In addition, each of the logic operation processing means includes two three-input selectors each receiving the output of the corresponding retrieval sense amplifier, an inverted value of the output of the corresponding retrieval sense amplifier, and a predetermined fixed logical value, and two switching transistors having a control input connected to an output of the two three-input selectors, respectively, one of the switching transistors being connected between an input of the memory circuit and a fixed voltage, and the other of the switching transistors being connected between an output of the memory circuit and the fixed voltage.

In the case of conducting a retrieval of a retrieval data, first, the retrieval of a first retrieval data $D(t)$ is conducted for the logical address memory block of the highest or first address rank, and the result $R(t)$ of the retrieval is stored in the hold means provided for each of the retrieval sense amplifiers. Then, the retrieval of a second retrieval data $D(t+1)$ is conducted for the same logical address memory block, and a logic operation between the result $R(t+1)$ of this current retrieval and the result $R(t)$ of the preceding retrieval stored in the hold means is executed in the logic operation processing means, and the result of this logic operation is stored back in the same hold means, in place of the result $R(t)$ of the preceding retrieval. Similarly, the retrieval of third and succeeding retrieval data $D(t+2)$, $D(t+3)$, . . . is conducted, retrieval data by retrieval data, for the same logical address memory block.

After a sequence of retrievals for the logical address memory block of the highest or first address rank have been completed, a similar sequence of retrievals are conducted for the logical address memory block of the next higher or second address rank. Further, a similar sequence of retrievals is repeated for the logical address memory blocks of lower address ranks, in the order of address ranks.

As mentioned above, the retrieval of a plurality of retrieval data $D(t)$, $D(t+1)$, $D(t+2)$, . . . , is conducted sequentially, retrieval data by retrieval data, for each of the logical address memory blocks, and a logic operation between the retrieval results $R(t)$, $R(t+1)$, $R(t+2)$, . . . , is conducted, whereby a retrieval equation processing can be executed.

On the other hand, if the logical address memory block is changed from one retrieval data from another, for example, after the retrieval of a first partial retrieval data $D(t)$ has been conducted for the logical address memory block of the highest or first address rank, if the retrieval of a succeeding second partial retrieval data $D(t+1)$ is conducted for the logical address memory block of the next higher or second address rank, it is possible to conduct a logic operation processing over a plurality of memory words of the memory words in common to each one retrieval sense amplifier. At this time, if the logic operation processing is a logical conjunction (AND) processing, it is possible to conduct a retrieval of a variable length word having a length longer than that of one memory word.

Accordingly, if the retrieval of a succeeding third partial retrieval data $D(t+2)$ is conducted for the logical address memory block of the third address rank, it is possible to conduct a retrieval of a variable length word having a length longer than that of two memory words.

As seen from the above description, the length of the variable length word which can be retrieved in the content addressable memory in accordance with the present invention is limited by the number of memory words provided in common to each retrieval sense amplifier. On the other hand, the length of the variable length word which can be retrieved in a prior art content addressable memory as mentioned hereinbefore, is limited by only the capability of the whole of the content addressable memory. Therefore, the length of the variable length word which can be retrieved in the content addressable memory in accordance with the present invention, is shorter than that in in the prior art content addressable memory. However, the length of the variable length word, which is actually retrieved, has an upper limit, and the content addressable memory in accordance with the present invention has almost no problem in practical use.

As explained above, the content addressable memory in accordance with the present invention is characterized in that the data held in a plurality of memory words in common to each retrieval sense amplifier can be retrieved as integral or continuous data, by use of the hold means and the logic operation processing means, which are provided for the same retrieval sense amplifier. Therefore, it is possible to conduct retrieval of a variable% length word having a length extending over two or more memory words of the memory words in common to each retrieval sense amplifier.

In addition, by repeatedly conducting logic operation processing on the result of a plurality of retrievals for the same memory word, it is possible to derive a retrieval equation for database processing.

The content addressable memory in accordance with the present invention can be constructed by providing the hold means of one bit for each of the retrieval sense amplifiers. Therefore, the overhead in area can be remarkably reduced as compared with a prior art content addressable memory requiring the hold means having a memory capacity corresponding to a few memory words.

The above and other objects, features and advantages of the present invention will be apparent from the following description of preferred embodiments of the invention with reference to the accompanying drawings.

BRIEF DESCRIPTION OF THE DRAWINGS

FIG. 6B is a table showing logic operations carried out in the control gate shown in FIG. 6A.

DESCRIPTION OF THE PREFERRED EMBODIMENT

Figure 4:
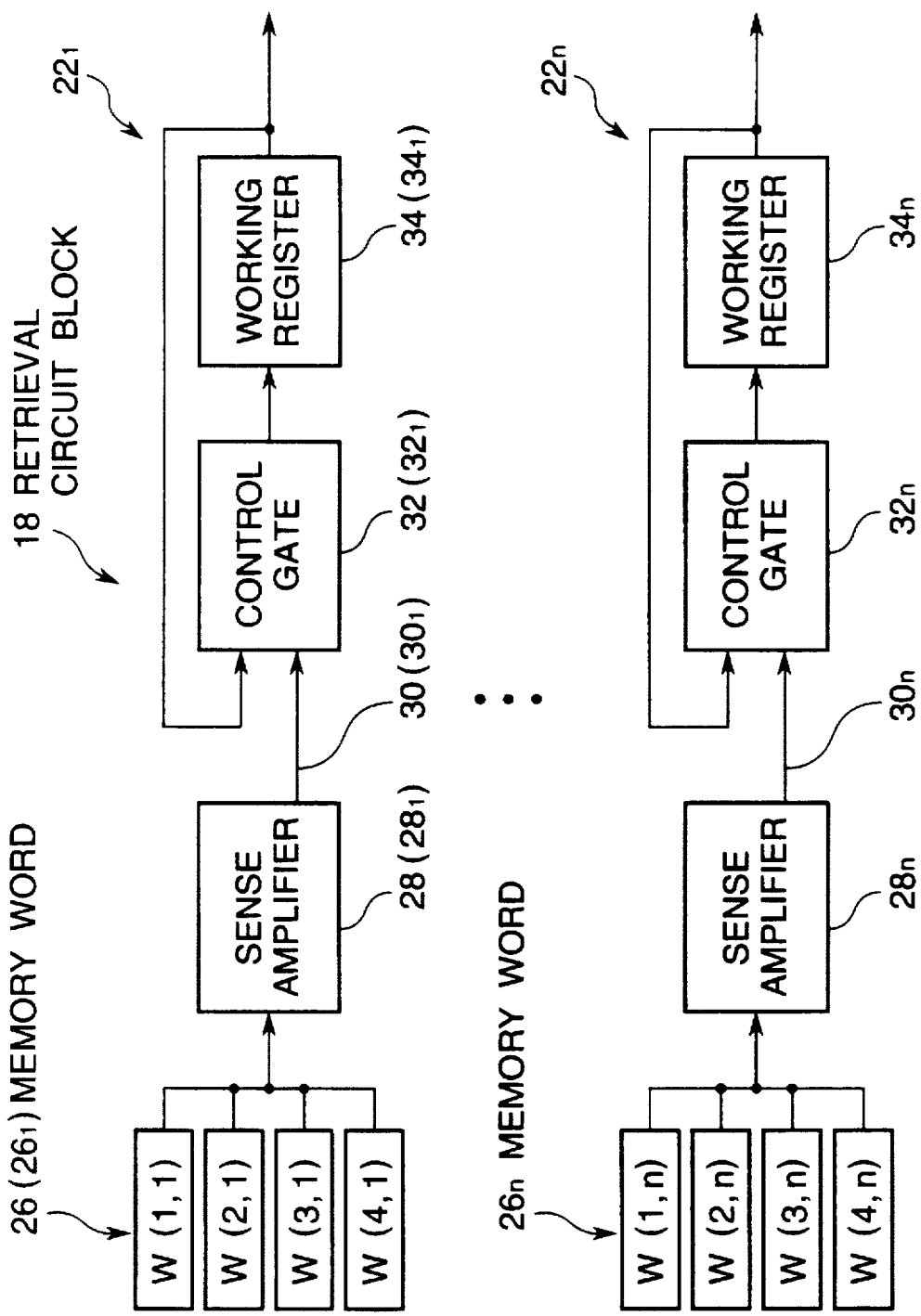
FIG. 4 is a block diagram of a portion of an embodiment of the content addressable memory in accordance with the present invention.

Referring to FIG. 4, there is shown a block diagram of a portion of an embodiment of the content addressable memory in accordance with the present invention. More specifically, FIG. 4 shows only memory words and retrieval circuits incorporated in the content addressable memory as shown in FIG. 2, and the portion shown in FIG. 4 corresponds in function to the portion shown in FIG. 1. Therefore, in FIG. 4, elements similar to those shown in FIG. 1 are given the same Reference Numerals, and explanation thereof will be omitted.

Figure 1:
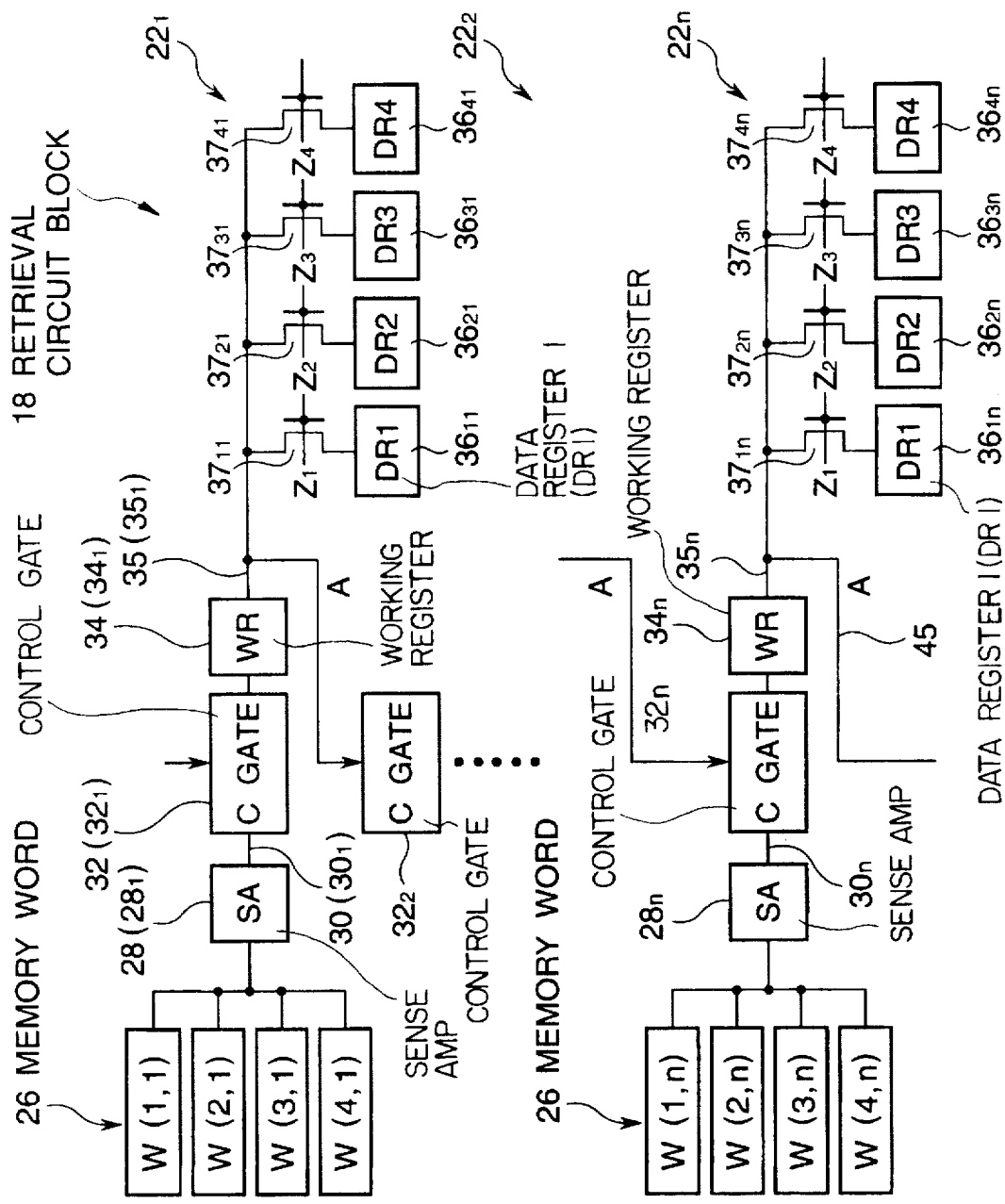
FIG. 1 is a block diagram of a portion of the prior art content addressable memory.
Figure 2:
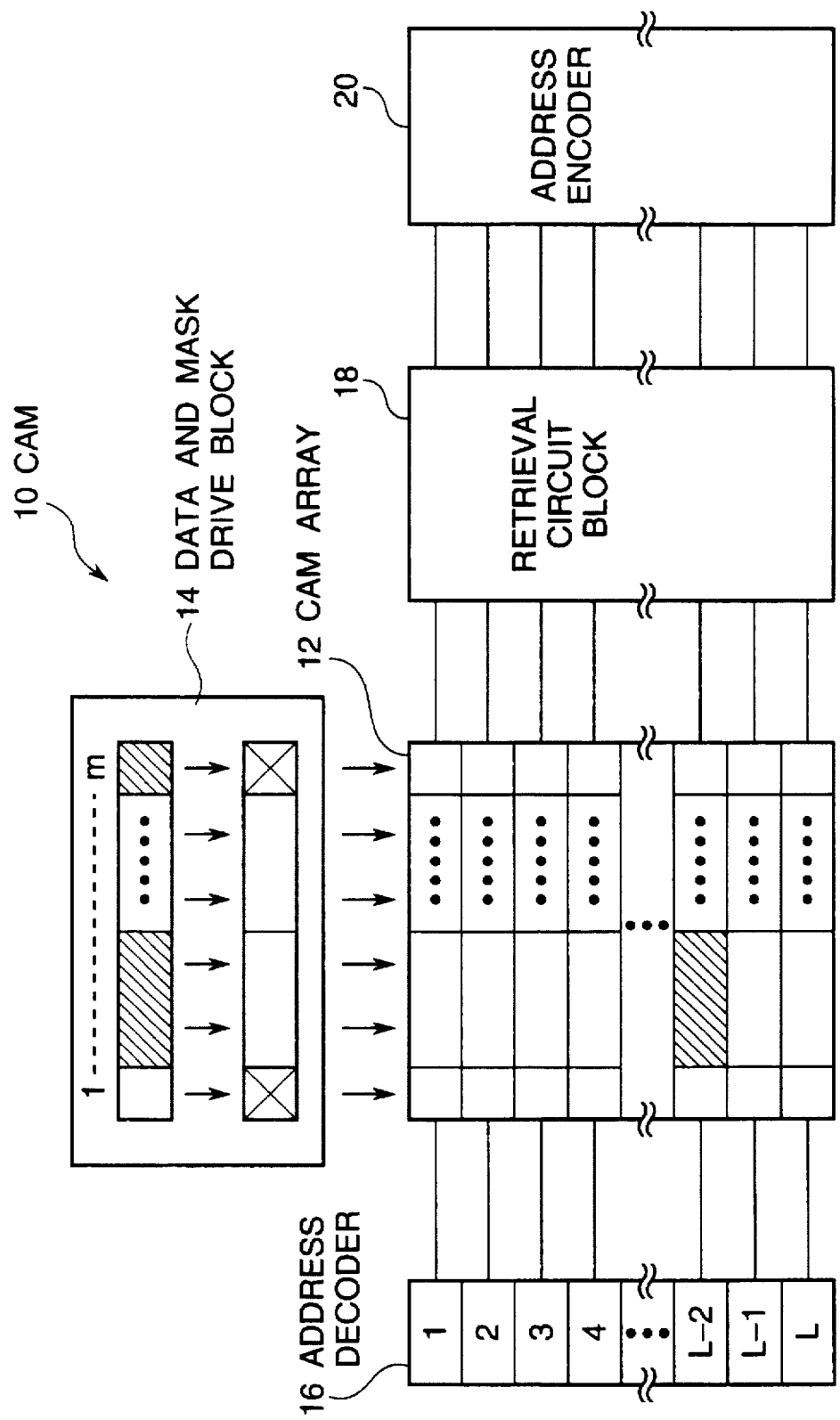
FIG. 2 is a block diagram of an overall prior art content addressable memory.

As seen from comparison between FIG. 1 and 4, the shown embodiment does not include the data registers provided in the prior art content addressable memory shown in FIG. 1, and the control gate 32 provided in the shown embodiment is constituted of a logic operation means executing a logic operation between the retrieval result R(t) of the corresponding memory word based on preceding retrieval data D(t), which is held in the working register 34, and the retrieval result R(t+1) of the corresponding memory word based on a current retrieval data D(t+1).

Various kinds of logic operations can be considered as the logic operations provided in the control gate 32, but in the shown embodiment, the control gate 32 has three kinds of logic operations, namely, (1) merely storing R(t+1), (2) a logical conjunction (AND) of R(t) and R(t+1) and (3) a logical disjunction (OR) of R(t) and R(t+1).

Figure 3:
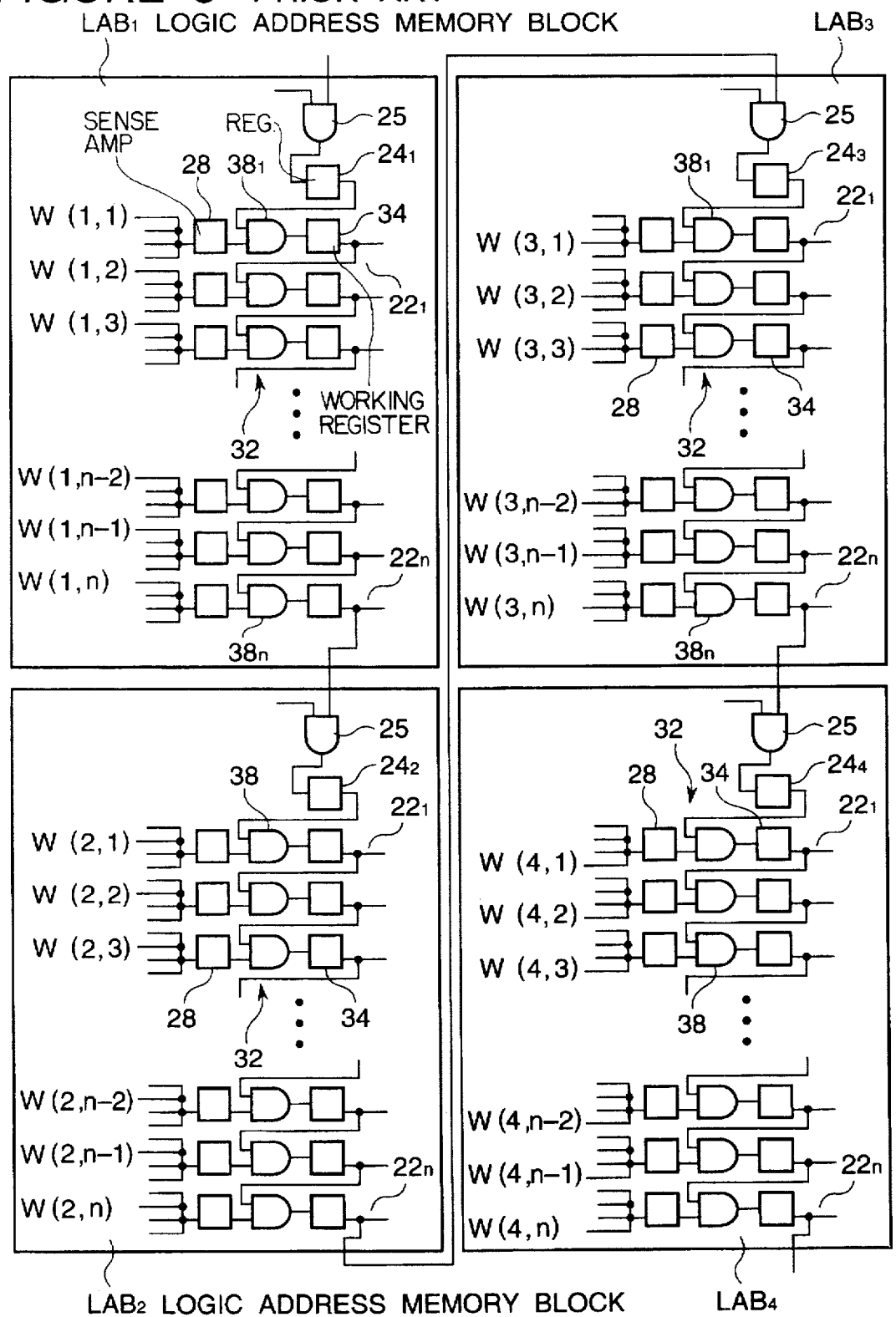
FIG. 3 illustrates the prior art content addressable memory divided into four logical address memory blocks.

Furthermore, in the shown embodiment, the memory words are divided into four logical address memory blocks $LAB_1$, $LAB_2$, $LAB_3$ and $LAB_4$, as shown in FIG. 3 and similarly to the prior art example mentioned hereinbefore. The retrieval is executed concurrently for all memory words within each of these four logical address memory blocks.

Now, one example of the retrieval operation of the shown embodiment will be described.

A retrieval of a first retrieval data D(t) is conducted. First, all the memory words 26 {W(1, 1), ..., W(1, n)} of the first logical address memory block $LAB_1$ are simultaneously driven, so that data held in the memory cells of these memory words are compared with the retrieval data D(t). On the basis of a "match" or "non-match" of the retrieval result R(t), the signal condition of the respective retrieval lines 30 ($30_1$, ..., $30_n$) changes or does not change, which is detected by the corresponding sense amplifier 28 ($28_1$, ..., $28_n$). The detection result is supplied to the corresponding control gate 32 ($32_1$, ..., $32_n$).

At this time, the control gate 32 ($32_1$, ..., $32_n$) outputs the output of the sense amplifier 28 ($28_1$, ..., $28_n$) without modification. Therefore, the retrieval result R(t) is held in the corresponding working register 34 ($34_1$, ..., $34_n$).

Thus, the retrieval of the retrieval data D(t) has been completed for the first logical address memory block $LAB_1$.

Next, the retrieval of a second retrieval data D(t+1) is conducted for the same first logical address memory block $LAB_1$. Similarly to the retrieval of the first retrieval data D(t), the retrieval result of the retrieval of the second retrieval data D(t+1) is supplied to the control gate 32. At this time, the control gate 32 outputs a logical conjunction (AND) between the output of the sense amplifier 28 and the output of the same working register 34, and the logical conjunction (AND) obtained is supplied to, and held by the working register 34. Thus, in the logical address memory block $LAB_1$, the retrieval for finding out the memory word matching both of the retrieval data D(t) and D(t+1) is completed.

By repeating a similar retrieval, it is possible to conduct the retrieval for D(t+2) and obtain the logical conjunction (AND) or logical disjunction (OR) between the result of the preceding retrievals and the retrieval result for D(t+2).

After a series of retrievals for the logical address memory block $LAB_1$ is completed, the retrieval for $D(t)$, $D(t+1)$, ..., similar to that conducted for the logical address memory block $LAB_1$, is conducted, block by block, for the second and succeeding logical address memory blocks $LAB_2$, $LAB_3$ and $LAB_4$.

Next, one example of the retrieval operation for a variable length word, of the shown embodiment, will be described.

A retrieval of a first retrieval data portion $D(t)$ is conducted for all the memory words $\{W(1, 1), \ldots, W(1, n)\}$ of the first logical address memory block $LAB_1$, as mentioned above. The control gate 32 outputs the output of the sense amplifier 28 without modification. Therefore, the retrieval result $R(t)$ is held in the corresponding working register 34.

Thus, the retrieval of the first retrieval data portion $D(t)$ has been completed for the first logical address memory block $LAB_1$.

Next, the retrieval of a second retrieval data portion $D(t+1)$ is conducted for for all the memory words $\{W(2, 1), \ldots, W(2, n)\}$ of the next, namely, second logical address memory block $LAB_2$. The control gate 32 outputs a logical conjunction (AND) between the output of the sense amplifier 28 and the output of the working register 34, and the logical conjunction (AND) obtained is supplied to and held by the working register 34.

Thus, the working register 34 holds the result of the retrieval of the data $D(t)+D(t+1)$ having a data length longer than the memory word length, for the logical address memory blocks $LAB_1$ and $LAB_2$.

Similarly, if the retrieval of a third retrieval data portion $D(t+2)$ is conducted for the third logical address memory block $LAB_3$ and the retrieval of a fourth retrieval data portion $D(t+3)$ is conducted for the fourth logical address memory block $LAB_4$, it is possible to obtain the result of the retrieval of the variable length data having an even longer data length.

Alternatively, if the retrieval of the retrieval data portion $D(t)$ is conducted for the second logical address memory block $LAB_2$ and the retrieval of the retrieval data portion $D(t+1)$ is conducted for the third logical address memory block $LAB_3$, it is possible to obtain the result of the retrieval of the variable length data starting from the logical address memory block $LAB_2$. Similarly, it is also possible to obtain the result of the retrieval of the variable length data starting from the logical address memory block $LAB_3$.

Figure 5:
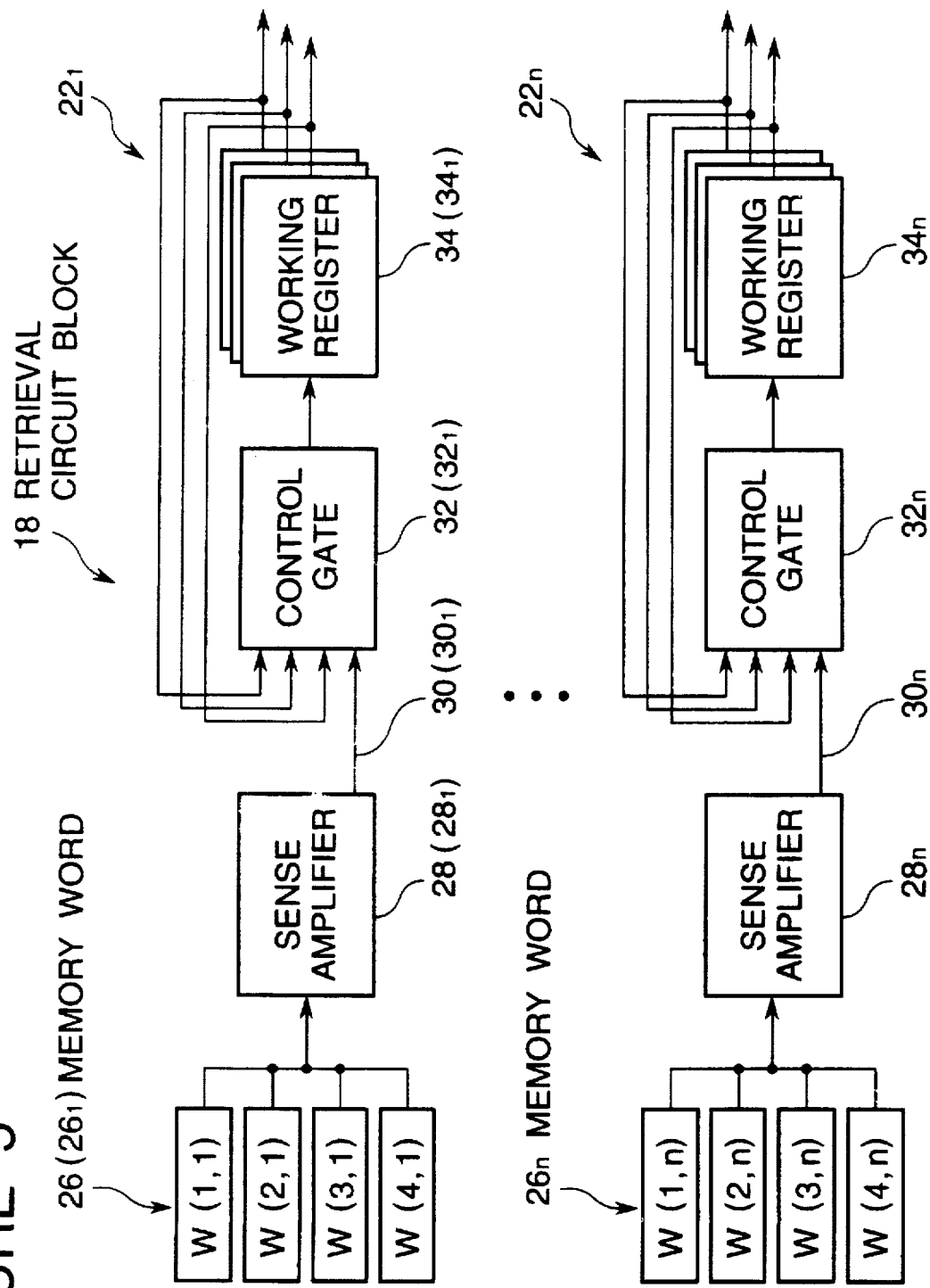
FIG. 5 is a block diagram of a portion of another embodiment of the content addressable memory in accordance with the present invention.

Referring to FIG. 5, there is shown a block diagram of a portion of another embodiment of the content addressable memory in accordance with the present invention. In FIG. 5, elements similar to those shown in FIG. 4 are given the same Reference Numerals, and explanation thereof will be omitted.

As seen from comparison between FIGS. 4 and 5, the second embodiment is so configured that, for each of the sense amplifiers 28, there are provided a plurality of working registers 34, and one input of the control gate 32 is connected to receive the output of the corresponding sense amplifier 28 and the other inputs of the control gate 32 are connected to receive the output of the plurality of associated working registers 34.

In this embodiment, the control gate 32 executes a logic operation between the output of the associated sense amplifier 28 and the output of the plurality of associated working registers 34, and the result of the logic operation is held in one of the plurality of associated working registers 34.

With this arrangement, the number of retrieval results for each sense amplifier can be increased, so that an increased number of retrieval processings can be carried out.

Figure 6A:
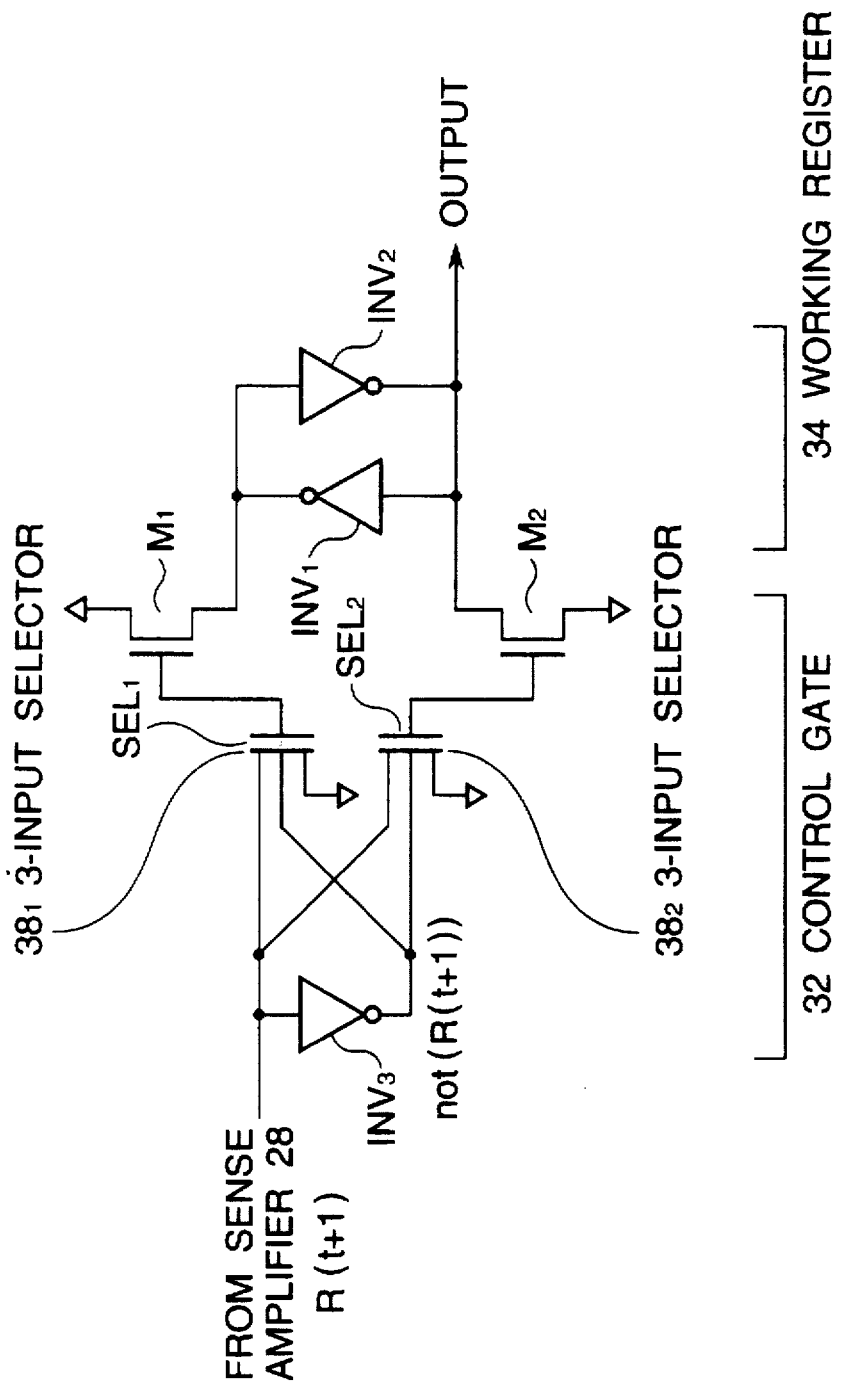
FIG. 6A is a circuit diagram of a working register and a control gate used in the content addressable memory in accordance with the present invention.

In the above mentioned embodiments, each working register 34 can be constituted of a flipflop circuit, which comprises a pair of inverters $INV_1$ and $INV_2$ each having an input connected to an output of the other inverter, as shown in FIG. 6A, and which is similar to a memory cell of a static RAM (SRAM).

Also as shown in FIG. 6A, the control gate 32 comprises a pair of 3-input selectors $SEL_1$ and $SEL_2$ ($38_1$ and $38_2$) each receiving the output "$R(t+1)$" of the sense amplifier 28, a signal "not $R(t+1)$" obtained by inverting the output $R(t+1)$ of the sense amplifier 28 by an inverter $INV_3$, and "0" (logical low level) as shown or "1" (logical high level), and a pair of MOS transistors $M_1$ and $M_2$ each receiving an output of a corresponding selector and each connected between a low power supply voltage (logical low level) or a high power supply voltage (logical high level) and a corresponding connection node of a pair of connection nodes between the inverters $INV_1$ and $INV_2$. More specifically, each of the MOS transistors $M_1$ and $M_2$ is of an N-channel type, and a source of each MOS transistor is connected to the low power supply voltage, namely, ground (GND).

By suitably selecting one of the three inputs in each of the selectors $SEL_1$ and $SEL_2$ ($38_1$ and $38_2$), various kinds of logic operations as shown in FIG. 6B can be executed between the output $R(t+1)$ of the sense amplifier 28 and the value $R(t)$ held in the working register 34, and the result of the logic operation executed is stored back in the same working register 34.

Now, explanation will be made on how some of the logic operations shown in FIG. 6B are executed in the circuit shown in FIG. 6A.

When the selector $38_1$ selects the inverted value "not(R (t+1))" of the output of the sense amplifier 28 and the selector $38_2$ selects the output "(R(t+1))" of the sense amplifier 28, if "(R(t+1))" is "1" (or "0"), the MOS transistor $M_1$ is rendered non-conductive (or conductive) and the MOS transistor $M_2$ is rendered conductive (or non-conductive), so that the input of the inverter $INV_1$ (or $INV_2$) is brought to "0", namely, the low level, and therefore, the output of the inverter $INV_1$ (or $INV_2$) is brought to "1", namely, the high level, with the result that the output of the flipflop is brought to "0" (or "1"). Namely, the inverted value "not(R(t+1))" of the output of the sense amplifier 28 is outputted and stored in the working register 34.

When the selector $38_1$ selects the inverted value "not(R (t+1))" of the output of the sense amplifier 28 and the selector $38_2$ selects "0", since the MOS transistor $M_2$ is non-conductive ("0" at its gate), if "(R(t+1))" is "1", the MOS transistor $M_1$ is rendered non-conductive (not(R(T+1)) is "0" at its gate, the working register 34 maintains the preceding stored value $R(t)$. To the contrary, if "(R(t+1))" is "0", the MOS transistor $M_1$ is rendered conductive, so that the input of the inverter $INV_2$ is brought to "0", and therefore, the output of the flipflop is brought to "1", namely, "not(R(t+1))". This means that the output of the flipflop is equivalent to a logical disjunction (OR) between "R(t)" and "not(R(t+1))".

Furthermore, when the selector $38_1$ selects "0" and the selector $38_2$ selects the output "(R(t+1))" of the sense amplifier 28, since the MOS transistor $M_1$ is non-conductive, if "(R(t+1))" is "1", the MOS transistor $M_2$ is rendered conductive, so that the input of the inverter $INV_1$ is brought to "0", and therefore, the output of the working register 34 is brought to "0". To the contrary, if "(R(t+1))" is "0", the MOS transistor $M_2$ is rendered non-conductive, and therefore, the working register 34 maintains the preceding stored value R(t). This means that the output of the flipflop of the working register 34 is equivalent to a logical conjunction (AND) between "R(t)" and "not(R(t+1))" (When R(t+1) is "0", R(t) is outputted).

When both the selectors $38_1$ and $38_2$ select "0", the MOS transistors $M_1$ and $M_2$ are non-conductive, and therefore, the output of the working register 34 maintains the preceding stored value R(t).

Thus, the circuit shown in FIG. 6A can carry out any arbitrary retrieval equation. In addition, the circuit shown in FIG. 6A is very advantageous in that the circuit shown in FIG. 6A can be constituted of a reduced number of circuit elements and therefore can be realized in a high circuit density and can operate under a reduced electric power consumption, as compared with the case when a circuit having a similar logic operation function is constituted of conventional complementary metal oxide semiconductor (CMOS) logic.

As seen from the above, the content addressable memory in accordance with the present invention can retrieve a variable word length data composed of a plurality of memory words in common to a retrieval sense amplifier, by carrying out a logic operation processing of the result of retrieval in each retrieval sense amplifier. Furthermore, it is possible to carry out the processing of any retrieval equation. On the other hand, since only the one-bit working register and the control gate are required for each one sense amplifier, the content addressable memory can be realized with an area reduced as compared with the prior art content addressable memory.

The invention has thus been shown and described with reference to the specific embodiments. However, it should be noted that the present invention is in no way limited to the details of the illustrated structures and changes and modifications may be made within the scope of the appended claims.

I claim:

1. A content addressable memory comprising:

a memory array composed of a number of memory words divided into a plurality of logical address memory blocks;

a plurality of retrieval sense amplifiers, each provided in common to a plurality of memory words of the same number as the number of said logical address memory blocks so hat said plurality of memory words are included, one in one, in said plurality of logical address memory blocks, respectively, and each of said logical address blocks is constituted of only a memory word of the logical address of the same rank within said plurality of memory words in common to each one of said plurality of retrieval sense amplifiers;

a plurality of hold means, each provided for a corresponding one of the retrieval sense amplifiers, for holding the result of retrieval outputted from the corresponding retrieval sense amplifier;

a plurality of logic operations processing means, each having a first input connected to an output of a corresponding one of said retrieval sense amplifiers, a second input connected to an output of a corresponding one of said hold means, and an output connected to an input of the corresponding hold means, each of said logical operation processing means executing a logic operation between the result of retrieval held in the corresponding hold means and the result of retrieval outputted from the corresponding retrieval sense amplifier, and the result of said logic operations being stored back in said corresponding hold means, the content addressable memory being so controlled that, when a retrieval is conducted, all the memory words included in a selected one of said plurality of logical address memory blocks are retrieved concurrently for the same retrieval data by means of the retrieval sense amplifiers, and said logic operation between the result of current retrieval outputted from each of said retrieval sense amplifiers and the result of the preceding retrieval held in the corresponding hold means is executed by the corresponding logic operation processing means, and the result of the logic operation executed is stored back in the same corresponding hold means.

2. A content addressable memory claimed in claim 1 wherein when a retrieval of a retrieval data having a data length longer than that of one memory word is conducted, the content addressable memory is so controlled that, all the memory words included in a first memory block of said plurality of logical address memory blocks are retrieved concurrently for a first retrieval data portion of the retrieval data by means of said retrieval sense amplifiers, and the retrieval result of said first retrieval data portion is stored in the plurality of hold means corresponding to each of said retrieval sense amplifiers, and then, all the memory words included in a second memory block of said plurality of logical address memory blocks including a memory word continuous in a logical address to each of the memory words included in said first memory block, are retrieved concurrently for a second retrieval data portion of the retrieval data continuous to said first retrieval data portion, by means of said retrieval sense amplifiers, and a logical conjunction (AND) operation between the current retrieval result of said second retrieval data portion outputted from each of said retrieval sense amplifiers and the preceding retrieval result of said first retrieval data portion held in the corresponding hold means is executed by the corresponding logic operation processing means, and the result of the logical operation executed is stored back in the same corresponding hold means, whereby the result of the retrieval of the retrieval data having a data word length extending over two memory words is obtained from each of said plurality of hold means.

3. A content addressable memory claimed in claim 1 wherein each of said retrieval sense amplifiers has an output connected to one input of a plurality of inputs of a corresponding logic operation processing means, and wherein for each of said retrieval sense amplifiers, there is a plurality of hold means each having an output connected to a corresponding one of the other inputs of said plurality of inputs of said corresponding logic operation processing means.

4. A content addressable memory claimed in claim 1 wherein all of said logic operation processing means are controlled to execute the same predetermined logic operation.

5. A content addressable memory claimed in claim 1 wherein each of said logic operation processing means is constituted of a control gate, and each of said hold means is constituted of a one-bit working register.

6. A content addressable memory claimed in claim 1 wherein each of said hold means is constituted of a memory circuit composed of a pair of inverters each having an input connected to an output of the other inverter, and wherein each of said logic operation processing means includes two three-input selectors each receiving the output of a corresponding retrieval sense amplifier, an inverted value of the output of the corresponding retrieval sense amplifier, and a predetermined fixed logical value, and two switching transistors having control inputs connected to outputs of said two three-input selectors, respectively, one of said switching transistors being connected between an input of said memory circuit and a fixed voltage, and the other of said switching transistors being connected between an output of said memory circuit and said fixed voltage.

7. A content addressable memory claimed in claim 6 wherein each of said two switching transistors is a metal oxide semiconductor (MOS) transistor.

* * * * *

UNITED STATES PATENT AND TRADEMARK OFFICE
CERTIFICATE OF CORRECTION

PATENT NO. : 5,787,458
DATED : July 28, 1998
INVENTOR(S) : Tohru MIWA

It is certified that error appears in the above-identified patent and that said Letters Patent is hereby corrected as shown below:

In Item No. [30], Foreign Application Priority Data, change

"Aug. 31, 1995  [JP]  Japan ...........................7-248767"   to

--Aug. 31, 1995  [JP]  Japan...........................7-248676--.

Signed and Sealed this

Twentieth Day of April, 1999

Attest:

Q. TODD DICKINSON

*Attesting Officer*                *Acting Commissioner of Patents and Trademarks*